United States Patent
Kuang et al.

(10) Patent No.: US 12,130,554 B2
(45) Date of Patent: Oct. 29, 2024

(54) METHOD AND APPARATUS FOR DIRECT WRITING PHOTOETCHING BY PARALLEL INTERPENETRATING SUPER-RESOLUTION HIGH-SPEED LASER

(71) Applicants: ZHEJIANG LAB, Zhejiang (CN); ZHEJIANG UNIVERSITY, Zhejiang (CN)

(72) Inventors: Cuifang Kuang, Hangzhou (CN); Hongqing Wang, Hangzhou (CN); Ziang Wang, Hangzhou (CN); Zhenyao Yang, Hangzhou (CN); Mengbo Tang, Hangzhou (CN); Lanxin Zhan, Hangzhou (CN); Xiaoyi Zhang, Hangzhou (CN); Jisen Wen, Hangzhou (CN); Xu Liu, Hangzhou (CN)

(73) Assignees: ZHEJIANG LAB, Hangzhou (CN); ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/404,934

(22) Filed: Jan. 5, 2024

(65) Prior Publication Data

US 2024/0176244 A1 May 30, 2024

Related U.S. Application Data

(63) Continuation of application No. PCT/CN2022/096829, filed on Jun. 2, 2022.

(30) Foreign Application Priority Data

Oct. 26, 2021 (CN) .......................... 202111248686.2

(51) Int. Cl.
*G03F 7/20* (2006.01)
*G03F 7/00* (2006.01)

(52) U.S. Cl.
CPC ........ *G03F 7/2053* (2013.01); *G03F 7/70391* (2013.01); *G03F 7/704* (2013.01)

(58) Field of Classification Search
CPC ..... G03F 7/2053; G03F 7/70391; G03F 7/704
See application file for complete search history.

(56) References Cited

U.S. PATENT DOCUMENTS

| 2002/0076655 A1* | 6/2002 | Borrelli | G02B 6/13 430/945 |
| 2007/0019175 A1 | 1/2007 | Ohsaki et al. | |
| 2022/0091512 A1* | 3/2022 | Zeng | G03F 7/2053 |

FOREIGN PATENT DOCUMENTS

| CN | 103984211 A | * 8/2014 | ............... G03F 7/20 |
| CN | 109491214 A | 3/2019 | |

(Continued)

OTHER PUBLICATIONS

English Translation of CN 103984211 A; Gao Guohan; Published: Aug. 13, 2014 (Year: 2014).*

(Continued)

*Primary Examiner* — Mark F. Huff
*Assistant Examiner* — Richard David Champion
(74) *Attorney, Agent, or Firm* — W&G Law Group

(57) ABSTRACT

A method and an apparatus for direct writing photoetching by parallel interpenetrating super-resolution high-speed laser. The method of the present application uses a parallel interpenetrating algorithm. Firstly, a multi-beam solid light spot for writing is generated based on a writing light spatial light modulator; a multi-beam hollow light spot for inhibition is generated based on an inhibition optical spatial light modulator; the multi-beam solid light spot is combined with the multi-beam hollow light spot to generate a modulated multi-beam light spot; a writing waveform is output based on a multichannel acousto-optic modulator, a displacement stage moves at a constant speed until writing of a whole (Continued)

column of areas is completed, an optical switch is turned off, and the displacement stage conducts one-time stepping movement; the process is not stopped until all patterns are written.

8 Claims, 4 Drawing Sheets

(56) References Cited

FOREIGN PATENT DOCUMENTS

| | | | |
|---|---|---|---|
| CN | 112068400 | A | 12/2020 |
| CN | 113515017 | A | 10/2021 |
| CN | 113960891 | A | 1/2022 |
| JP | 2003203853 | A | 7/2003 |
| JP | 2003260815 | A | 9/2003 |

OTHER PUBLICATIONS

International Search Report (PCT/CN2022/096829); Date of Mailing: Aug. 25, 2022.
First Office Action(CN202111248686.2); Date of Mailing: May 30, 2023.

* cited by examiner ism METHOD AND APPARATUS FOR DIRECT WRITING PHOTOETCHING BY PARALLEL INTERPENETRATING SUPER-RESOLUTION HIGH-SPEED LASER

CROSS-REFERENCE TO RELATED APPLICATIONS

The present application is a continuation of International Application No. PCT/CN2022/096829, filed on Jun. 2, 2022, which claims priority to Chinese Application No. 202111248686.2, filed on Oct. 26, 2021, the contents of both of which are incorporated herein by reference in their entireties.

TECHNICAL FIELD

The present application belongs to the field of two-photon laser direct writing photoetching, in particular to a method and an apparatus for direct writing photoetching by parallel interpenetrating super-resolution high-speed laser.

BACKGROUND

Two-photon laser direct writing can realize the processing of mesoscopic objects of a mm-cm level while maintaining the high accuracy at the nm-um level. This ability allows people to realize micro-scale or even nano-scale functional characteristics on mesoscale objects, which is particularly important in the research field of high-precision new complex devices and structures, such as on-chip integrated systems, micro-nano optics, metamaterials and so on. At present, there are still some problems in two-photon laser direct writing photoetching technology, among which the difficulty in realizing high-speed writing at mesoscale is the main factor restricting its further popularization, and the main reasons are insufficient scanning speed and imperfect writing strategy.

Replacing the traditional galvanometer with higher-speed scanning elements, such as a polyhedral scanning mirror (PLS), also known as a rotating mirror, or an acousto-optic deflector (AOD), can effectively improve the writing speed. On the other hand, using multi-beam synchronous scanning is also an effective method to improve the writing speed. How to combine them effectively is a mainstream direction in the development of two-photon laser direct writing photoetching. At present, an AOD is difficult to be combined with multi-beam scanning because of the high requirement of light incident angle and group velocity dispersion, while the rotating mirror can achieve the same scanning speed as an AOD and is easy to be combined with multi-beam scanning. However, the rotating mirror can only scan in the same direction, so it is not flexible enough in use. At present, the method of multi-beam parallel laser direct writing using edge photoinhibition technology combined with the rotating mirror is relatively simple, and it is difficult to really play the advantages of multi-beam rotating mirror scanning.

SUMMARY

In view of the shortcomings of the prior art, the present application aims to provide a method and an apparatus for direct writing photoetching by parallel interpenetrating super-resolution high-speed laser.

The purpose of the present application is realized by the following technical solution: a method for direct writing photoetching by parallel interpenetrating super-resolution high-speed laser, including the steps of:

a) generating a beam of writing light laser based on a writing light laser;
b) generating multiple writing light beams propagating in different diffraction directions based on a writing light optical diffractometer;
c) generating a beam of inhibited light laser based on an inhibited light laser;
d) generating multiple inhibited light beams propagating in different diffraction directions based on an inhibited light optical diffractometer;
e) combining the writing light and the inhibited light based on a dichroic mirror to form multiple modulated beams;
f) modulating an arrangement direction of the combined multiple beams based on an image rotator;
g) moving at a constant speed in a longitudinal direction based on a displacement stage;
h) high-speed-transverse-scanning the multiple beams based on a rotating mirror;
i) outputting a multichannel writing waveform based on a multichannel high-speed optical switch;
j) the displacement stage moving at a constant speed until writing of a whole column of areas is completed, turning off an optical switch, and step-moving the displacement stage for one time; and
k) repeating the steps e)-j) until all patterns are written.

In an embodiment, the step of generating multiple writing light beams propagating in different diffraction directions based on a writing light optical diffractometer includes: using a spatial light modulator to load a multipoint pattern hologram to generate multiple writing light beams, or using a diffractive optical element DOE to generate multiple writing light beams.

In an embodiment, the step of generating multiple inhibited light beams propagating in different diffraction directions based on an inhibited light optical diffractometer includes: using a spatial light modulator to load a multipoint pattern hologram to generate multiple solid spot beams, and further superposing $0$-$2\pi$ vortex phases to generate multiple hollow inhibited light beams.

Further, in the step of modulating an arrangement direction of the combined multiple beams based on an image rotator, a modulation angle $\theta_r$ satisfies:

$$n \times N_{beams} \times \delta d + \delta d = D|\sin\theta_r| + D|\cos\theta_r| \cdot \delta d / L_{max}$$

where the modulation angle $\theta_r$ is defined as an included angle between a scanning direction of the rotating mirror and the arrangement direction of the multiple beams; $\delta d$ indicates a line spacing (solution/um); n is an integer, which means that a first beam reaches a designated position after n times of scanning, a distance between the position and a first writing position of a last beam of the multiple beams being $\delta d$; $N_{beams}$ indicates the number of the beams, which is an integer; D indicates a distance between two adjacent beams of the multiple beams; $L_{max}$ indicates a maximum length that the rotating mirror can reach in a single scanning on a focal plane of an objective lens.

Further, in the step of moving at a constant speed in a longitudinal direction based on a displacement stage, the moving direction is perpendicular to the scanning direction of the rotating mirror, and the moving speed $v_s$ satisfies:

$$v_s = \delta d / L_{max} \cdot v_{PLS}$$

where $v_{PLS}$ indicates a scanning speed of the rotating mirror.

Further, in the step of outputting a multichannel writing waveform based on a multichannel high-speed optical switch, the output multichannel writing waveform satisfies the parallel interpenetrating algorithm, which includes the following steps of:
  a) first, only outputting the writing waveform of a $N_{beams}{}^{th}$ beam;
  b) starting to output the writing waveform of a $N_{beams}-1^{th}$ beam after n times of scanning;
  c) starting to output the writing waveform of a $N_{beams}-2^{th}$ beam after n times of scanning; and
  d) repeating steps b)-c) until all beam waveforms start to be output.

Further, during step-moving the displacement stage fro one time, the moving direction of step-moving the displacement stage for one time is parallel to the writing direction of the rotating mirror; a moving distance $L_{step}$ is: $L_{step}=L_{max}-L_{useless}$, where $L_{useless}$ indicates an invalid writing area, $L_{useless}=L_{out}+D\times N_{beams}|\cos\theta_r|$, where a first term $L_{out}$ indicates an invalid writing length caused by cutting a light spot by the edge of the rotating mirror, and a second term indicates the invalid writing length caused by inclination of the multiple beams.

An apparatus for implementing the above method, including:
  a writing light laser used for emitting writing laser;
  a writing light group velocity dispersion compensation unit used for offsetting a positive group velocity dispersion generated by the writing light in subsequent optical path propagation;
  a writing light beam expanding and shaping apparatus used for generating high-quality beam-expanded and collimated writing light;
  a writing light optical diffractometer used for generating high-throughput parallel writing light beams;
  a writing light multichannel high-speed optical switch apparatus used for independently controlling the on-off of each sub-beam in the high-throughput parallel writing light beams;
  an inhibited light laser used for emitting inhibited light laser;
  an inhibited light beam expanding and shaping apparatus used for generating high-quality beam-expanded and collimated inhibited light;
  an inhibited light optical diffractometer used for generating high-throughput parallel inhibited light beams;
  an inhibited light multichannel high-speed optical switch apparatus used for independently controlling the on-off of each sub-beam in the high-throughput parallel inhibited light beams;
  an image rotator apparatus used for continuously adjusting an arrangement direction of the multiple beams and a scanning direction of a rotating mirror;
  a high-speed rotating mirror used for realizing horizontal parallel scanning of the high-throughput parallel writing light beams;
  a scanning lens system used for focusing high-throughput parallel writing light beams on a photoetching sample; and
  a sample translation movement mechanism configured to vertically step-move and large-range-three-dimensional move the photoetching sample.

In an embodiment, the laser uses a 780 nm femtosecond laser.

In an embodiment, the inhibited light laser uses a 532 nm continuous laser.

In an embodiment, the group velocity dispersion compensation unit includes a group velocity dispersion compensation element, several reflecting mirrors and a one-dimensional displacement stage; the femtosecond laser repeatedly passes through the group velocity dispersion compensation element guided by the reflecting mirror, for a total of four times; the compensation amount can be adjusted by adjusting the distance between the first incidence and the second incidence through a one-dimensional displacement stage.

In an embodiment, the group velocity dispersion compensation element includes, but is not limited to, the following elements: a grating and a prism.

In an embodiment, refer to the following literature for the calculation method of the compensation amount: Kim, D. U., et al., Two-photon microscopy using an Yb(3+)-doped fiber laser with variable pulse widths. Opt Express, 2012. 20(11): p. 12341-9.

In an embodiment, the calculation method of the positive group velocity dispersion generated in the subsequent optical path propagation is as follows:
  a) determining all optical elements in the system that can generate group velocity dispersion;
  b) determine the materials used for the above elements;
  d) inquiring the group velocity dispersion (GVD) of each material in the literature or online database;
  d) determining the thickness d of each element;
  e) determining the total group delay dispersion (GDD) of the system according to the formula $GDD=\Sigma GVD_i \times d_i$, $i=1, 2, 3 \ldots$, where i indicates the $i^{th}$ element.

In an embodiment, the optical diffractive apparatus includes but is not limited to the following devices: a spatial light modulator (SLM) and a diffractive optical element (DOE).

In an embodiment, the multichannel high-speed optical switch uses a multichannel acousto-optic modulator.

In an embodiment, the beam expanding apparatus comprises two lenses, and the focal points of the two lenses placed in front and back are coincident, and there is the following relationship between the focal lengths $f_1$, $f_2$ and the incident/emergent spot sizes $$D_1, D_2: \frac{f_1}{f_2} = \frac{D_1}{D_2}.$$

In an embodiment, on the basis of the beam expanding apparatus, the shaping apparatus places a pinhole at the focal position where the two lenses overlap, and the pinhole size D is determined by the following formula: $D=\lambda f/r$, where $\lambda$ indicates the wavelength, f indicates the focal length of the incident lens, and r indicates the radius at the energy $1/e^2$ of the incident beam.

In an embodiment, the image rotator apparatus includes, but is not limited to, the following devices: a Dowell prism and a three-sided reflecting mirror.

In an embodiment, the scanning lens system includes a scanning lens, a field lens and an objective lens. The scanning lens and the field lens form a 4f system, which is placed between the rotating mirror and the objective lens, and the rotating mirror and the objective lens are respectively placed at the front and rear focal planes of the 4f system.

In an embodiment, the sample translation movement mechanism includes, but is not limited to, the following devices: a piezoelectric displacement stage, an air bearing displacement stage, a mechanical electric displacement stage, a manual displacement stage, and a combination containing at least one of the above devices.

The present application has the following beneficial effects:

(1) The present application provides a set of high-speed parallel laser direct writing system apparatus. The image rotator is used to rotate the arrangement direction of multiple beams, and the modulation angle $\theta_r$ is continuously adjusted by the image rotator, so that a high-speed parallel space-interpenetrating writing method can be realized. The problem of slow writing speed caused by a simple scanning strategy in the traditional rotating mirror laser direct writing system is solved.

(2) The present application provides a high-speed parallel rotating mirror scanning method, which uses an image rotator to adjust the included angle between the multi-beam arrangement direction and the rotating mirror scanning direction, and uses a parallel interpenetrating algorithm to scan, thus achieving the most efficient scanning. It solves the problem of simple scanning strategy in the traditional rotating mirror laser direct writing system, and can effectively improve the writing efficiency;

(3) The present application introduces multi-beam inhibited light, modulates a solid light spot into a hollow light spot by adding 0-2π vortex light phases, and inhibits the writing light based on the edge photoinhibition effect, so as to improve the writing resolution. Compared with the traditional two-photon writing, it has higher resolution and writing accuracy.

DESCRIPTION OF EMBODIMENTS

In order to explain the purpose, technical solution and advantages of the present application more clearly, the present application will be further described in detail with examples and drawings. It should be understood that the specific embodiments described here are only used to explain the present application, and are not used to limit the present application. Those skilled in the art who make modifications or equivalent substitutions on the basis of understanding the technical solution of the present application without departing from the principle and spirit of the technical solution of the present application shall be covered by the protection scope of the present application.

The present application relates to an apparatus for direct writing photoetching by parallel interpenetrating super-resolution high-speed laser, which consists of a writing light laser, a writing light group velocity dispersion compensation unit, a writing light/inhibited light beam expanding/shaping apparatus, a writing light/inhibited light optical diffractometer, a writing light/inhibited light multichannel high-speed optical switch apparatus, an image rotator apparatus, a high-speed rotating mirror, a scanning lens system and a sample translation motion mechanism.

Figure 1:
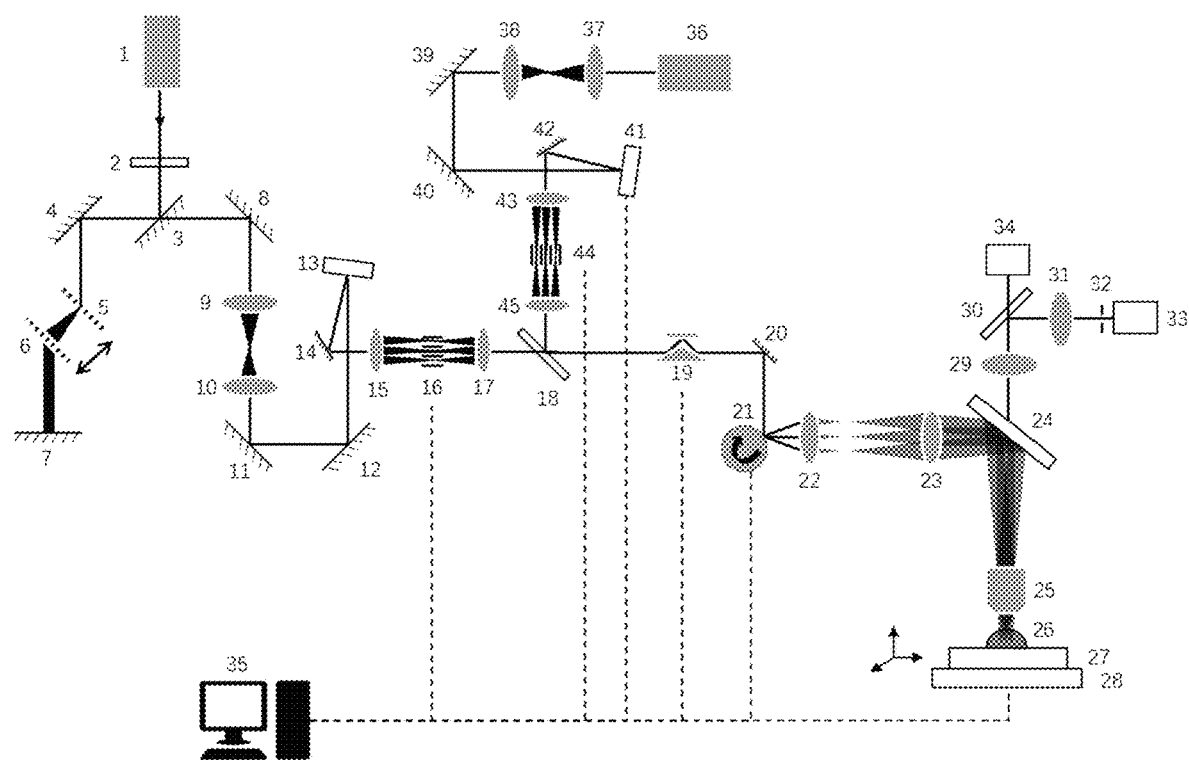
FIG. 1 is a schematic diagram of an apparatus for direct writing photoetching by parallel interpenetrating super-resolution high-speed laser according to the present application; in the figure: 1, 780 nm femtosecond laser; 2, 780 nm half-wave plate; 3-4, Reflecting mirrors; 5-6, Diffraction gratings; 7, Roof reflecting mirror; 8, Reflecting mirror; 9-10 and 4f, Beam expanding lens groups; 11-12, Reflecting mirror; 13, 780 nm spatial light modulator; 14, Reflecting mirror; 15. Lens; 16, 780 nm multichannel acousto-optic modulator; 17, Lens; 18, Dichroic mirror; 19, Image rotator; 20, Reflecting mirror; 21, Rotating mirror; 22, Scanning lens; 23, Field mirror; 24, Dichroic mirror; 25, High NA objective lens; 26, Photoresist sample; 27, Piezoelectric displacement stage; 28, Air bearing displacement stage; 29, Imaging lens; 30, Equal-proportion beam splitter; 31, Condensing lens; 32, Diaphragm; 33, Lighting source; 34, Camera; 35, Computer; 36, 532 nm continuous light laser; 37-38 and 4f, Beam expanding lens group; 39-40, Reflecting mirrors; 41, 532 nm spatial light modulator; 42, Reflecting mirror; 43, Lens; 44, 532 nm multichannel acousto-optic modulator; 45. Lens.

As shown in FIG. 1, an embodiment of the present application is specifically as follows: the 780 nm femtosecond laser 1 (a writing light laser) generates a beam of 780 nm femtosecond laser, and the polarization direction is adjusted through the 780 nm half-wave plate 2. After the laser direction is adjusted by the reflecting mirrors 3-4, the laser passes through the diffraction gratings 5-6, and then the beam is lifted by the roof reflecting mirror 7, and then returns to the diffraction gratings 6-5. The reflecting mirror 3 is selected as a D-type reflecting mirror, and the beam returned from the diffraction grating 5 is reflected by the reflecting mirror 4, propagates from above the reflecting mirror 3 (i.e., passes over the reflecting mirror 3), and is reflected by the reflecting mirror 8 into the beam expanding lens groups 9-10 to complete beam expansion. The beam direction is adjusted by reflecting mirrors 11-12 and then the laser enters a 780 nm spatial light modulator 13, and the single beam is modulated into multiple beams by loading a hologram on the spatial light modulator 13. The beam is reflected by the reflecting mirror 14, and the hologram is Fourier-transformed by a lens 15, so that multiple focal points are generated at the focal plane of the lens 15. A 780 nm multichannel acousto-optic modulator 16 is placed at the focal plane of the lens 15, and each channel passes through a focal point to realize independent modulation of each beam. The divergent light is re-collimated by the lens 17, passes through the dichroic mirror 18 and enters the image rotator 19.

In addition, the 532 nm continuous light laser 36 (an inhibited light laser) generates a beam of 532 nm continuous light laser, which passes through the beam expanding lens groups 37-38 to complete beam expansion. The beam direction is adjusted by reflecting mirrors 39-40 and then the beam enters the 532 nm spatial light modulator 41. By loading a hologram on the spatial light modulator 41, a single beam is modulated into multiple beams, which are solid light spots at this time, and the solid light spots are modulated into hollow light spots by superimposing 0-2π vortex light phases on the hologram, thus generating the inhibited light of the hollow light spots. The beam is reflected by the reflecting mirror 42, and the hologram is Fourier-transformed by the lens 43, so that multiple focal points of hollow inhibited light are generated at the focal plane of the lens 43. A 532 nm multichannel acousto-optic modulator 44 is placed at the focal plane of the lens 43, and each channel passes through a focal point to realize independent modulation of each beam. The divergent light is collimated by the lens 45, combined with the writing light through the dichroic mirror 18, and enters the image rotator 19 together.

Figure 4:
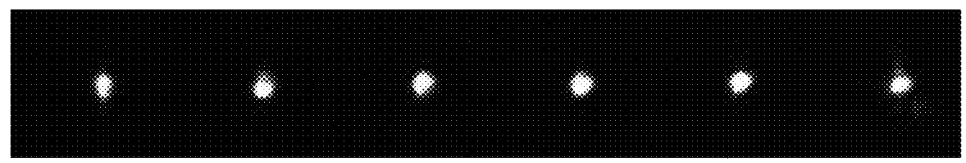
FIG. 4 is an experimental imaging diagram of a solid 6-beam generated by a 780 nm spatial light modulator at the focal plane of the objective lens.
Figure 5:
FIG. 5 is an experimental imaging diagram of a hollow 6-beam generated by a 532 nm spatial light modulator at the focal plane of the objective lens.

The writing light and the inhibited light are modulated by the image rotator 19, reflected by the mirror 20 and then enter the rotating mirror 21. The multiple beams are reflected by the rotating mirror 21, pass through the scanning lens 22 and the field mirror 23, and then are reflected by the dichroic mirror 24 into the high-NA objective lens 25 and are focused on the photoresist sample 26. The piezoelectric displacement stage 27 and the air bearing displacement stage 28 drive the photoresist sample 26 to scan under the program control. The lighting source 33 is an LED lamp, and the illuminating light emitted by the lighting source 33 is converted into parallel light by the condensing lens 31 after passing through the diaphragm 32, and then reflected by the equal-proportion beam splitter 30, and then passes through the imaging lens 29 and the dichroic mirror 24 in turn to be focused at the entrance pupil of the high-NA objective lens 25. In addition, the image at the photoresist sample 26 passes through the high-NA objective lens 25, the dichroic mirror 24, the imaging lens 29 and the equal-proportion beam splitter 30 in turn and is imaged at the camera 34 for writing observation. As shown in FIG. 4, the solid spot image of six-beam writing light measured at the focal plane of the high NA objective lens 25 in the experiment is shown. As shown in FIG. 5, the imaging diagram of the hollow spot of six-beam inhibited light measured at the focal plane of the high NA objective lens 25 in the experiment is shown.

Figure 2:
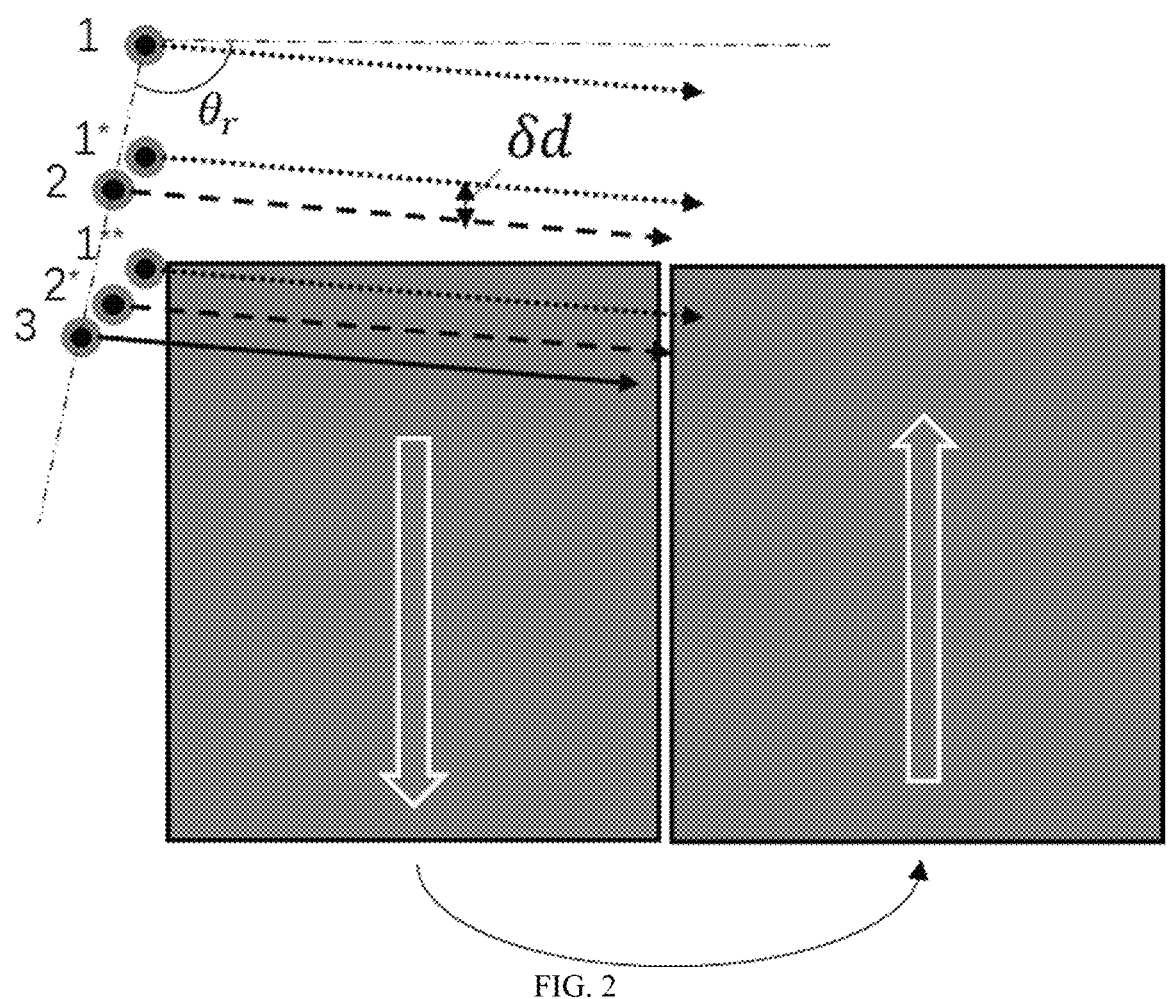
FIG. 2 is a schematic diagram of the method for direct writing photoetching by parallel interpenetrating super-resolution high-speed laser of the present application, and the hollow arrow indicates the writing direction.
Figure 3:
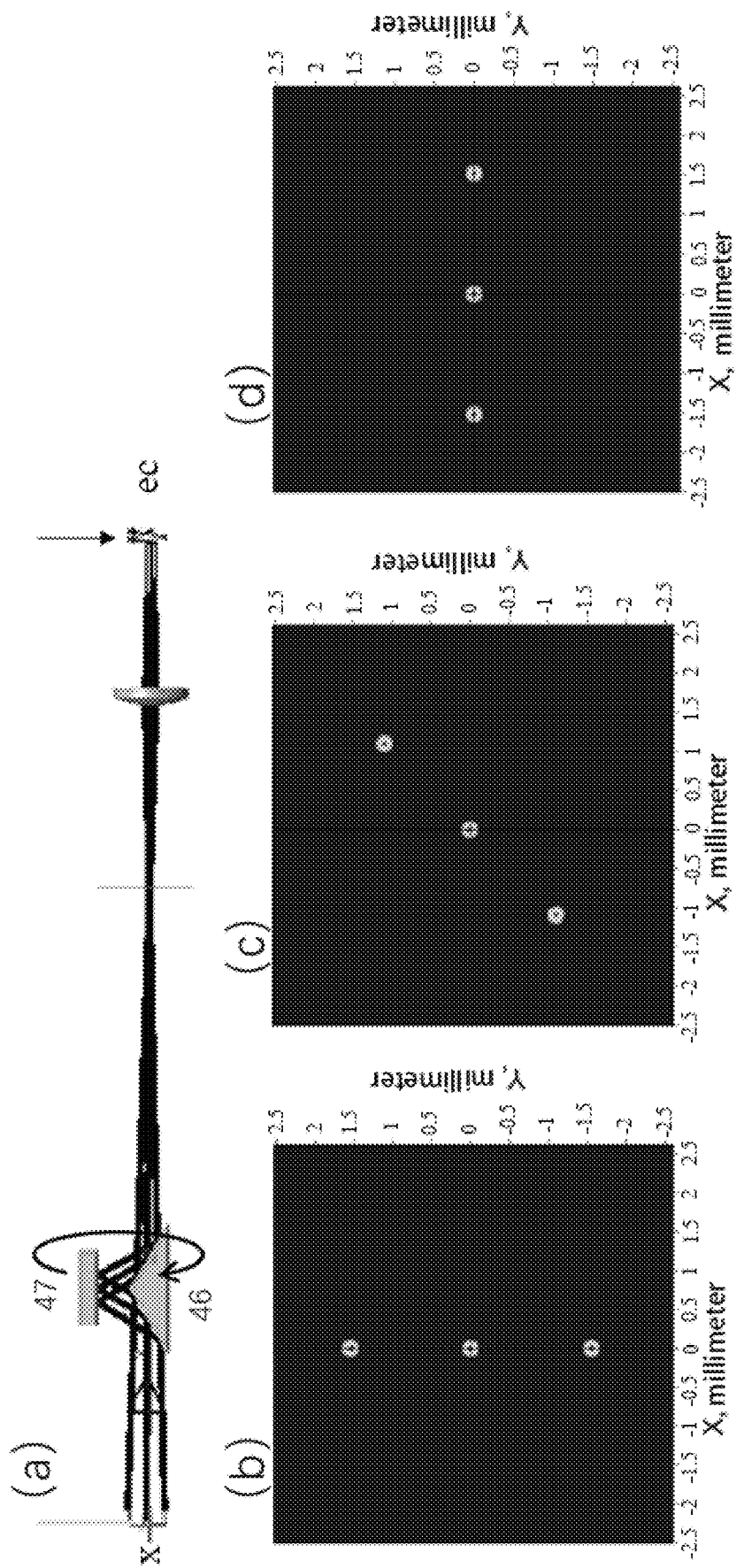
FIG. 3 is a schematic diagram of an image rotator apparatus in the present application; in the figure: 46. Reflective prism; 47. Reflecting mirror.

As shown in FIG. 2, the method for direct writing photoetching by parallel interpenetrating super-resolution high-speed laser in the present application provides an innovative scanning mode-interpenetrating scanning, which will be illustrated by taking three beams in the figure as an example. FIGS. 1, 2 and 3 indicate the initial three beams, where the light spot consists of solid writing light spots and hollow inhibited light spots concentrically superimposed. For the convenience of expression, it is first considered that 1\*, 2\* means the second scanning and 1\*\* means the third scanning. A core idea here is that three beams of light form a scanning unit, but the three beams of light in this scanning unit are not beams at the same moment in time. For example, the 1\*\* of the third scanning and the 2\* of the second scanning form a scanning unit with the 3 of the first scanning, which is called as interpenetrating scanning here. In fact, from 1 to 1\* is often not completed at one time, and the formula to be satisfied here is:

$$n \times N_{beams} \times \delta d + \delta d = D|\sin\theta_r| + D|\cos\theta_r| \cdot \delta d / L_{max}$$

where $\delta d$ indicates the line spacing (parallel to the scanning direction of the displacement stage) and the resolution/um; n is an integer, which means that the beam 1 reaches the 1\* position after n times of scanning, where the 1\* position is defined as the position at a distance of $\delta d$ from the beam 2; $N_{beams}$ indicates the number of beams, which is an integer; D indicates the distance between the starting points of two adjacent beams (as shown in the figure, the distance between the black spots of beams 1 and 2); $\theta_r$ indicates the included angle between the arrangement direction of the multiple beams and the scanning direction of the rotating mirror; $L_{max}$ indicates the maximum length that the rotating mirror can reach in a single scanning on the focal plane of the objective lens. The displacement stage moves at a constant speed until the whole column of left areas is written. The optical switch is turned off and then the displacement stage is step-moved for one time as shown by the arrow at the bottom of FIG. 2.

As shown in FIG. 3(a), the design solution of an image rotator apparatus of the present application is specifically as follows: the vertex angle of the reflecting prism 36 is 120°, and the distance H between the vertex angle and the reflecting mirror 37 and the hypotenuse L satisfy L=2H; the arrow in the figure refers to the image plane. (b), (c) and (d) in FIG. 3 are the simulation results of (a). The simulation results show that the rotation of the arrangement direction of multiple beams on the image plane with the rotation of the image rotator. (b) shows that the image rotator is 0°, at which time multiple beams are vertically arranged; (c) shows that the image rotator is 22.5°, at which time the multiple beams are arranged with a rotation of 45°; (d) shows that the image rotator is 45°, at which time the multiple beams rotate by 90° and are arranged horizontally.

What is claimed is:

1. A method for direct writing photoetching by parallel interpenetrating super-resolution high-speed laser, comprising:

step a) generating a beam of writing light laser based on a writing light laser;

step b) generating multiple writing light beams propagating in different diffraction directions based on a writing light optical diffractometer;

step c) generating a beam of inhibited light laser based on an inhibited light laser;

step d) generating multiple inhibited light beams propagating in different diffraction directions based on an inhibited light optical diffractometer;

step e) combining the writing light beams and the inhibited light beams based on a dichroic mirror to form modulated multiple beams;

step f) modulating an arrangement direction of the multiple beams based on an image rotator;

step g) moving at a constant speed in a longitudinal direction based on a displacement stage;

step h) transversely high-speed-scanning the multiple beams based on a rotating mirror;

step i) outputting a multichannel writing waveform based on a multichannel high-speed optical switch;

step j) the displacement stage moving at a constant speed until writing of a whole column of areas is completed, turning off an optical switch, and step-moving the displacement stage for one time; and step k) repeating the steps e)-j) until all patterns are written.

2. The method for direct writing photoetching by parallel interpenetrating super-resolution high-speed laser according to claim 1, wherein in the step f), a modulation angle $\theta_r$ satisfies:

$$n \times N_{beams} \times \delta d + \delta d = D|\sin\theta_r| + D|\cos\theta_r| \cdot \delta d / L_{max}$$

where the modulation angle $\theta_r$ is defined as an included angle between a scanning direction of the rotating mirror and the arrangement direction of the multiple beams; n is an integer, representing that a first beam reaches a designated position after n times of scanning, $\delta d$ is a line spacing, representing a distance between the designated position and a first writing position of a last beam of the multiple beams, $N_{beams}$ represents a number of the multiple beams, being an integer; D represents a distance between two adjacent beams of the multiple beams; $L_{max}$ represents a maximum length that the rotating mirror reaches in a single scanning on a focal plane of an objective lens.

3. The method for direct writing photoetching by parallel interpenetrating super-resolution high-speed laser according to claim 1, wherein in the step g), a moving direction is perpendicular to a scanning direction of the rotating mirror, with moving speed vs satisfying:

$$v_s = \delta d/L_{max} \cdot v_{PLS}$$

where $v_{PLS}$ represents a scanning speed of the rotating mirror.

4. The method for direct writing photoetching by parallel interpenetrating super-resolution high-speed laser according to claim 1, wherein in the step i), the output multichannel writing waveform satisfies the parallel interpenetrating algorithm, and comprises:
  sub-step i1) outputting only a writing waveform of a $N_{beams}{}^{th}$ beam;
  sub-step i2) starting to output a writing waveform of a $N_{beams}-1^{th}$ beam after n times of scanning;
  sub-step i3) starting to output a writing waveform of a $N_{beams}-2^{th}$ beam after n times of scanning; and
  sub-step i4) repeating the steps i2)-i3) until all beam waveforms start to be output.

5. The method of direct writing photoetching by parallel interpenetrating super-resolution high-speed laser according to claim 1, wherein in the step j), a moving direction of step-moving the displacement stage for one time is parallel to a writing direction of the rotating mirror, with a moving distance $L_{step}$ satisfying:

$$L_{step} = L_{max} - L_{useless}$$

$$L_{useless} = L_{out} + D \times N_{beams} |\cos \theta_r|$$

where $L_{useless}$ represents an invalid writing area, a first term $L_{out}$ represents an invalid writing length caused by cutting a light spot by the edge of the rotating mirror, and a second term $D \times N_{beams}|\cos \theta_r|$ represents an invalid writing length caused by inclination of the multiple beams.

6. An apparatus for implementing the method according to claim 1, comprising:
  a writing light laser configured to emit writing laser;
  a writing light group velocity dispersion compensation unit configured to offsetting a positive group velocity dispersion generated by writing light beams in subsequent optical path propagation;
  a writing light beam expanding and shaping apparatus configured to generating high-quality, beam-expanded and collimated writing light beams;
  a writing light optical diffractometer configured to generate high-throughput parallel writing light beams;
  a writing light multichannel high-speed optical switch apparatus configured to independently control on-off of each sub-beam in the high-throughput parallel writing light beams;
  an inhibited light laser configured to emit inhibited light laser;
  an inhibited light beam expanding and shaping apparatus configured to generating high-quality, beam-expanded and collimated inhibited light;
  an inhibited light optical diffractometer configured to generate high-throughput parallel inhibited light beams;
  an inhibited light multichannel high-speed optical switch apparatus configured to independently control on-off of each sub-beam in the high-throughput parallel inhibited light beams;
  an image rotator apparatus configured to continuously adjust an arrangement direction of the multiple beams and a scanning direction of a rotating mirror;
  a high-speed rotating mirror configured to horizontally parallel-scan the high-throughput parallel writing light beams;
  a scanning lens system configured to focus high-throughput parallel writing light beams on a photoetching sample; and
  a sample translation movement mechanism configured to vertically step-move and large-range-three-dimensional move the photoetching sample.

7. The apparatus according to claim 6, wherein the group velocity dispersion compensation unit comprises a group velocity dispersion compensation element, a plurality of reflecting mirrors and a one-dimensional displacement stage, wherein an optical diffractometer comprises a spatial light modulator (SLM), a digital micromirror device (DMD) and a diffractive optical element (DOE), wherein the multichannel high-speed optical switch apparatus is a multichannel acousto-optic modulator, wherein the scanning lens system comprises a scanning lens, a field lens and an objective lens, and a combination comprising at least one of the above three lenses, wherein the sample translation movement mechanism comprises: a piezoelectric displacement stage, an air bearing displacement stage, a mechanical electric displacement stage, a manual displacement stage, and a combination comprising at least one of the above three stages, wherein the image rotator apparatus comprises a Dowell prism and a three-sided reflecting mirror.

8. The apparatus according to claim 7, wherein the group velocity dispersion compensation element comprises a grating and a prism.

* * * * *